United States Patent [19]
Dickol et al.

[11] Patent Number: 5,381,421
[45] Date of Patent: Jan. 10, 1995

[54] PER PIN CIRCUIT TEST SYSTEM HAVING N-BIT PIN INTERFACE PROVIDING SPEED IMPROVEMENT WITH FREQUENCY MULTIPLEXING

[75] Inventors: John E. Dickol, Poughkeepsie; Algirdas J. Gruodis, Wappingers Falls; Dale E. Hoffman, Fishkill, all of N.Y.

[73] Assignee: International Business Machines Corporation, Armonk, N.Y.

[21] Appl. No.: 846,320

[22] Filed: Mar. 5, 1992

Related U.S. Application Data

[63] Continuation-in-part of Ser. No. 464,473, Jan. 12, 1990, Pat. No. 5,127,011.

[51] Int. Cl.$^6$ .................. G01R 31/28; G06F 11/00
[52] U.S. Cl. ........................................ 371/27; 371/25.1
[58] Field of Search .................. 371/27, 22.1, 25.1, 371/22.3

[56] References Cited

U.S. PATENT DOCUMENTS

| | | | |
|---|---|---|---|
| 4,450,560 | 5/1984 | Conner | 371/27 |
| 4,682,330 | 7/1987 | Millham | 371/20 |
| 4,688,233 | 8/1987 | Nishiwaki et al. | 375/58 |
| 4,727,312 | 2/1988 | Fulks | 371/27 |
| 4,775,977 | 10/1988 | Dehara | 371/27 |
| 4,806,852 | 2/1989 | Suan et al. | 371/27 |
| 4,855,681 | 8/1989 | Millham | 328/62 |
| 4,928,278 | 5/1990 | Otsuji et al. | 371/27 |
| 4,931,723 | 6/1990 | Jeffrey et al. | 371/27 |
| 5,153,883 | 10/1992 | Hayashi et al. | 371/27 |

OTHER PUBLICATIONS

Gruodis, A. J., et al., "250-MHZ Advanced Test Systems", IEEE Design & Test of Computers, pp. 24–35.
Chang, Y. E., et al., "A 250 MHZ Advanced Test System" Proceedings of International Test Conference, Sep. 1987, pp. 68–75.
McArdle, J. M., "A 250 MHZ Advanced Test System Software", Proceedings of International Test Conference, Sep. 1987, pp. 85–93.
Grasso, L. J., et al., "A 250 MHZ Test System Timing and Auto Calibration", Proceedings of International Test Conference, Sep. 1987, pp. 76–84.
Waicukauski, J. A., et al., "Fault Detection Effectiveness of Weighted Patterns", Proceedings of International Test Conference, 1988, pp. 245–249.

*Primary Examiner*—Robert W. Beausoliel, Jr.
*Assistant Examiner*—Joseph E. Palys
*Attorney, Agent, or Firm*—H. Daniel Schnurmann

[57] ABSTRACT

A method, and apparatus for accomplishing the method, for controlling an operation of a test pin of a per-pin semiconductor device test system. The method includes the steps of, during a test cycle, generating a plurality of timing signals, providing a test pattern comprised of M-bits, and decoding the M-bits into one of $2^M$ first multi-bit control words. In accordance with logical states of bits of the first control word, the method selects specified ones of the timing signals and generates a stimulus signal at a test pin in accordance with the selected specified ones of the timing signals. In accordance with an aspect of the invention, the step of providing provides test patterns at a rate of (x) test patterns per second, the step of generating generates test pin stimulus signals at a rate of (y) stimulus signals per second, and wherein (y)=n(x), where (n) is an integer greater than one.

25 Claims, 12 Drawing Sheets

FIG. 8

| SET1 | RESET 1 | SET2 | RESET2 | DATA | OUTPUT FORMAT FROM FORMATTER 24 | |
|---|---|---|---|---|---|---|
| T1 | INH | INH | INH | 1 | ⎨CYCLE⎬ | NRZ |
| INH | T1 | INH | INH | 0 |  | NRZI |
| T1 | T2 | INH | INH | 1 | —DRZ | RZ |
| T2 | T1 | INH | INH | 0 | —DR1 | R1 |
| T1 | INH | INH | INH | 1 |  | DNRZ |
| INH | T1 | INH | INH | 0 |  | DNRZI |
| T1 | INH | INH | INH | 1 |  | F1 |
| INH | T1 | INH | INH | 0 |  | F0 |
| T1 | T2 | T3 | INH | 0 |  | SBC |
| INH | T1 | T2 | T3 | 1 |  | SBCI |
| T1 | T2 | T3 | T4 | 1 | —DDP | DOUBLE PULSE |
| T2 | T1 | T4 | T3 | 0 | —DDP | DOUBLE PULSE I |

T1 < T2 < T3 < T4 < T5 IN TIME DELAY
INH = INHIBIT TIMING PULSE

FIG. 9

| EACH ROW CORRESPONDS TO ONE OF THE SIXTEEN WORDS IN THE ARRAY 62 |||||||||||| |
|---|---|---|---|---|---|---|---|---|---|---|---|
| SET 1 ||| RESET 1 ||| SET 2 ||| RESET 2 ||| OUTPUT WAVEFORM |
| BIT SET 1 ||| BIT SET 2 ||| BIT SET 3 ||| BIT SET 4 ||| |
| 0 | 0 | 0 | 0 | 0 | 1 | 0 | 0 | 0 | 0 | 0 | 0 | NRZ 0 AT TIME PLACEMENT #1 |
| 0 | 0 | 1 | 0 | 1 | 0 | 0 | 0 | 0 | 0 | 0 | 0 | RZ WITH FALLING EDGE OCCURRING AT TIME PLACEMENT #2 |
| 0 | 0 | 1 | 0 | 1 | 1 | 0 | 0 | 0 | 0 | 0 | 0 | RZ WITH FALLING EDGE OCCURRING AT TIME PLACEMENT #3 |
| 0 | 1 | 0 | 0 | 0 | 1 | 0 | 0 | 0 | 0 | 0 | 0 | R1 WITH FALLING EDGE OCCURRING AT TIME PLACEMENT #2 |
| NOTE: EDGE 1 = REF, EDGE 2 = REF + 3NS, EDGE 3 = REF + 5NS |||||||||||| |

FIG. 10

| SET 1 ||| RESET 1 ||| SET 2 ||| RESET 2 ||| OUTPUT WAVEFORM |
|---|---|---|---|---|---|---|---|---|---|---|---|
| BIT SET 1 ||| BIT SET 2 ||| BIT SET 3 ||| BIT SET 4 ||| |
| 0 | 0 | 1 | 0 | 0 | 0 | 0 | 0 | 0 | 0 | 0 | 0 | NRZ1 |
| 0 | 0 | 0 | 0 | 0 | 1 | 0 | 0 | 0 | 0 | 0 | 0 | NRZ0 |

FIG. 11

| SET 1 ||| RESET 1 ||| SET 2 ||| RESET 2 ||| OUTPUT WAVEFORM |
|---|---|---|---|---|---|---|---|---|---|---|---|
| BIT SET 1 ||| BIT SET 2 ||| BIT SET 3 ||| BIT SET 4 ||| |
| 0 | 0 | 1 | 0 | 0 | 0 | 0 | 0 | 0 | 0 | 0 | 0 | NRZ1 |
| 0 | 0 | 0 | 0 | 0 | 1 | 0 | 0 | 0 | 0 | 0 | 0 | NRZ0 |
| 0 | 0 | 1 | 0 | 1 | 0 | 0 | 0 | 0 | 0 | 0 | 0 | RZ |
| 0 | 1 | 0 | 0 | 0 | 1 | 0 | 0 | 0 | 0 | 0 | 0 | R1 |

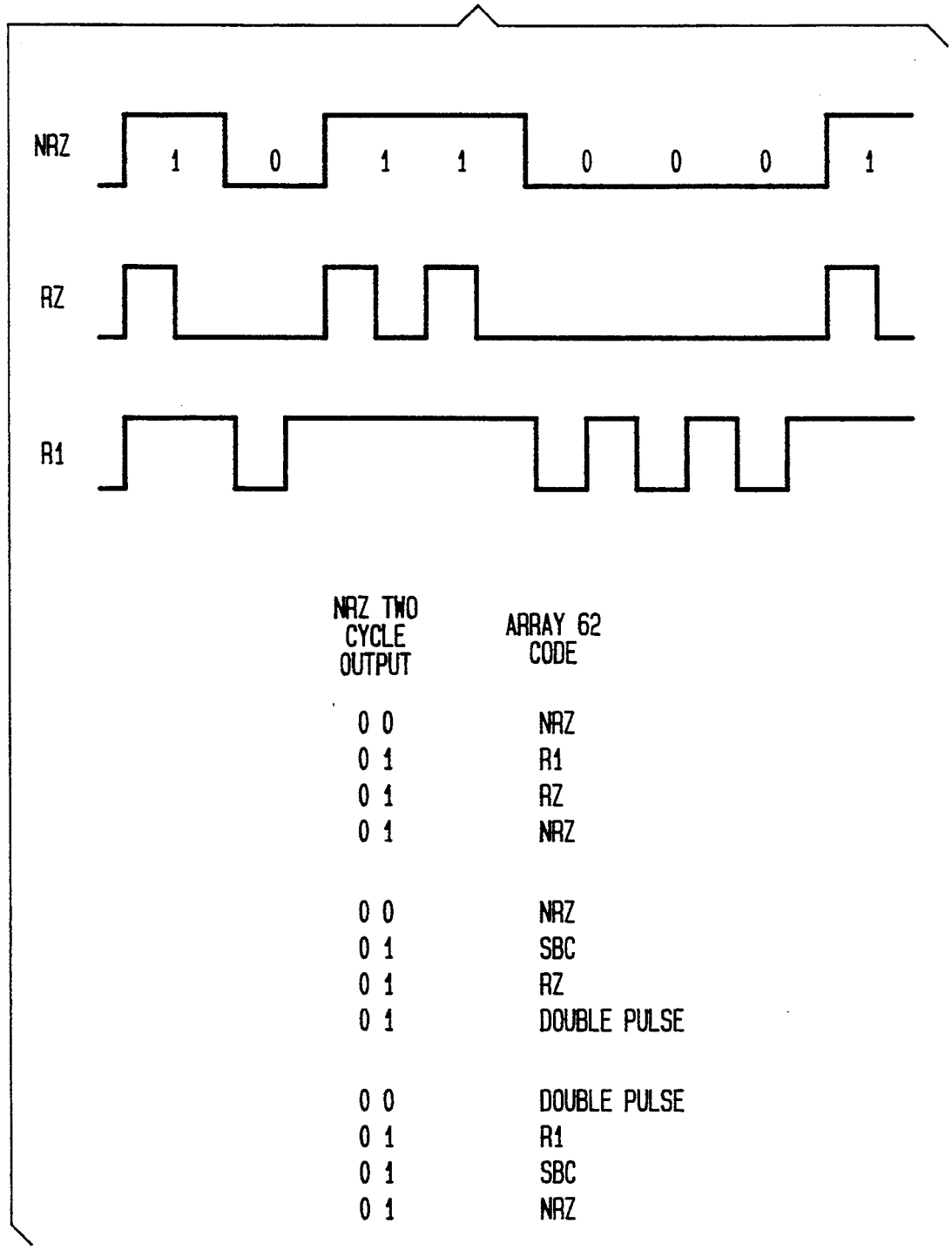

PER PIN CIRCUIT TEST SYSTEM HAVING N-BIT PIN INTERFACE PROVIDING SPEED IMPROVEMENT WITH FREQUENCY MULTIPLEXING

This patent application is a continuation-in-part of U.S. patent application Ser. No. 07/464,473, filed Jan. 12, 1990, entitled "PER-PIN INTEGRATED CIRCUIT TEST SYSTEM HAVING N-BIT PIN INTERFACE", by Michael L. Combs et al., now U.S. Pat. No. 5,127,011, issued Jun. 30, 1992.

FIELD OF THE INVENTION

This invention relates generally to circuit test systems known as per-pin test systems and, in particular, to a per-pin test system having for each pin an N bit interface for precisely specifying test signals generated by the pin.

BACKGROUND OF THE INVENTION

A generalized true per-pin test system is illustrated in FIG. 1. The per-pin test system has substantially identical circuitry dedicated to each of a plurality (n) of test pins to process test data going to a Device Under Test (DUT) and coming from the DUT. The system includes test pattern generating electronics, also referred to as a pattern generator, and test pin electronics for coupling to the DUT. The DUT may be, by example, an integrated circuit provided on a wafer comprising a plurality of identical circuits could be many. The DUT may also be a partially packaged integrated circuit having been previously scribed from the wafer. A controller, typically a data processor, is coupled to the test system through an interface for controlling the operation thereof.

Examples of per-pin test systems are described in a journal article "250-MHZ Advanced Test Systems", IEEE Design & Test of Computers, pps. 24–35, 1988 by A. J. Gruodis and D. E. Hoffman. Additionally, reference is made to the following publications: Y. E. Chang, D. E. Hoffman, A. J. Gruodis, J. E. Dickol, "A 250 MHz Advanced Test System", Proceedings of International Test Conference", September 1987, pp. 68–75; J. M. McArdle, "A 250 MHz Advanced Test System Software", Proceedings of International Test Conference, September 1987, pp. 85–93; and L. Grasso, C. E. Morgan, M. S. Peloquin, F. Rajan, "A 250 MHz Test System Timing and Auto Calibration", Proceedings of International Test Conference, September 1987, pp. 76–84.

In a true per-pin test system, there are identical sets of pattern generator and test pin electronics provided for each of the tester system pins. In most, if not all, embodiments it is advantageous to physically divide the test system into a pattern generator module and into a pin electronics module, wherein the pin electronics module is disposed closely adjacent to the DUT to minimize signal delays and is electrically interconnected by cables to the typically much larger pattern generator module. The pattern generator module stores the test pattern control data, processes the outgoing test data, performs algorithmic test pattern generation, and processes the data that returns from the pin electronics module. The pin electronics module receives the test data and converts the data into electrical signals that interface through a plurality of test pins to the DUT. The pin electronics module in operation performs a number of subsidiary tasks including: (a) varying a logical value, format and functional mode of the applied test data on a per-pin basis, (b) varying voltage levels sent to or expected from the DUT on a per-pin basis, and (c) varying the signal edge timings of the pin on a per-pin basis.

In high performance and high accuracy semiconductor device test systems such per-pin control is highly desirable and provides several advantages. For example, even small variances between a pin's wiring and electronics may cause unacceptable degradations in the signal quality or timing. Although care is given to the design of test systems to minimize per-pin differences and circuitry is also often included to match separate sets of pin electronics, in high performance test systems these approaches still do not guarantee a required level of uniform performance from pin to pin.

Thus, although a highly flexible per-pin specification capability is necessary to maintain a uniformity of test stimuli amongst a possibly large number of test pins, many types of test systems do not provide an adequate per-pin test specification capability that satisfactorily overcomes the tester deficiencies resulting from pin variability and other related problems. One reason for this lack of pin programmability is related to the required physical separation of the pin electronics module and the pattern generator electronics module. In that it is practical to provide only a relatively few interconnections between the modules for each pin, only a corresponding limited number of pin states can therefor be specified. The tendency of modern testers to increase the number of test pins further limits the number of per-pin interconnects that can be provided.

Also, many conventional test systems, in order to make a change in format, timing, or voltage conditions of a pin driver, require that the test system be placed into a wait state while the pin's condition is reprogrammed. In test programs of typical complexity such pin reprogramming occurs many times during the test program. As a result, the time delay incurred for each system wait state is incremental, resulting in a significant throughput loss.

Furthermore, a general purpose test system for VLSI logic must be capable of efficiently testing, at the chip or the module level, sequential and combinatorial logic, storage arrays such as Read Only Memory (ROM), and Random Access Memory (RAM) arrays embedded in logic. In that VLSI chips containing logic are preferably designed with Level Sensitive Scan Design (LSSD) shift register techniques to enhance testability, the ability to test embedded memory and also LSSD structures must be supported by the test system.

Also, for very high levels of integration or for multichip modules the number of data vectors (X) that are required to test the product with a high level of test coverage becomes large. To eliminate the need to generate, transport/transmit, and store this large quantity of data, Weighted Random Pattern (WRP) testing with signature analysis at the DUT output pins is employed. WRP testing is described in commonly assigned U.S. Pat. No. 4,688,233, Aug. 18, 1987, "Weighted Random Pattern Testing Apparatus and Method", by F. Motika and J. A. Waicukauski and also by J. A. Waicukauski and E. Lindbloom in "Fault Detection Effectiveness of Weighted Random Patterns", Proceedings of International Test Conference, 1988, pp. 245–249. As such, the provision of a test system that readily implements both deterministic and WPR testing is important.

In U.S. Pat. No. 4,775,977, Oct. 4, 1988, entitled "Pattern Generating Apparatus", Dehara discloses a pattern generator for testing integrated circuit devices. A pattern memory 1A has a two bit output applied to both a driver pattern generator 1C and an expected pattern generator 1D. When an output of an IO memory 1B is a logic "1" the driver pattern generator generates a combination of waveforms in dependence on the two bit output from pattern memory 1A. When an output of the IO memory 1B is a logic "0" the expected pattern generator 1D decodes the two bit output to generate an expected pattern.

This technique is said to allow a driver pattern having a waveform corresponding to a given combination of different waveforms to De generated in synchronism with a timing signal and to also simplify testing the integrated circuit for a high impedance output condition. However, this teaching of Dehara appears to be limited to interconnections made between units normally associated with pattern generating devices and, as a result, does not alleviate the problem of specifying a large number of pin-states or pin-conditions, such as formats, edge timing, driver voltage levels and receiver threshold levels, receiver strobe timing on a per-pin basis, with a relatively small number of readily implemented interconnections made between a pattern generator module and a pin electronics module.

In commonly assigned U.S. Pat. No. 4,682,330 Millham discloses a per pin test system. At col. 5, lines 1-28 it is stated that a pin control memory contains sufficient storage to provide up to 16 unique testing functions. The pin control memory has an input addressed with up to four bits from a pin address memory, which in turn receives input from an address generator. An output of the pin control memory is provided to a decoder and driver/sensor block 46. However, this patent does not specifically address timing pulse generation.

It is an object of this invention to provide a true per-pin test system wherein a selectable number of bits are employed to precisely control the timing of signals applied to a DUT, and/or to precisely specify the expected states of signals received from a DUT.

It is another object of this invention to provide a true per-pin test system wherein a selectable number of bits are employed to precisely control a format of an input stimulus waveform applied to a DUT, with the format being changeable from a first format to a second format during a test cycle.

It is a further object of this invention to provide a true per-pin test system wherein a selectable number of bits are employed to precisely control the timing of signals applied to a DUT in such a manner as to effectively double a test pin stimulus rate over a rate of test pattern generation.

It is another object of the invention to provide a true per-pin test system that employs a plurality of timing signals and a multiplexer arrangement for selecting specified ones of the timing signals as inputs to set/reset terminals of a D-flip/flop element, with the output of the D-flip/flop element driving a test pin.

SUMMARY OF THE INVENTION

The foregoing problems are overcome and the objects of the invention are realized by method and apparatus for specifying, in a true per-pin architecture test system, the timing characteristics, waveform format characteristics, and rate of generation of test signals presented to a DUT, with a high degree of flexibility, with high precision, and with no performance degradation.

Further in accordance with the invention there is provided apparatus for controlling an operation of a test pin of a semiconductor device test system. The apparatus includes pattern and control storage memory for storing and for outputting information related to a state of the test pin for individual ones of a plurality of consecutive test cycles. The apparatus further includes a pattern processor which employs up to N bits of data from the storage memory, for every cycle, to produce M bits/cycle (where $M \geq N$). The apparatus further includes a pin control decoding memory having an input coupled to the output of the pattern processor for decoding each of the M-bit words into command words, each command word including a plurality of control bits. Predetermined combinations of the plurality of control bits are coupled to pin driver circuitry for specifying, for each of the test cycles, at least one characteristic of an electrical signal transmitted to the test pin, including one or more test pin waveform formats. The test system also includes test pin signal receiving circuitry for coupling to the test pin for receiving an electrical signal therefrom. Other control bits are coupled to the receiving circuitry for specifying, for each of the test cycles, at least one operating characteristic associated with the receiving circuitry, and also specifying a time at which to latch the received electrical signal.

That is, the invention teaches apparatus and method for controlling an operation of a test pin of a per-pin semiconductor device test system. A method includes the steps of, during a test cycle, generating a plurality of non-overlapping timing signals, providing a test specifier comprised of M-bits, and decoding the M-bits into one of $2^M$ first multi-bit control words. In accordance with logical states of bits of the first control word, the method selects specified ones of the timing signals and generates a stimulus signal at a test pin in accordance with the selected specified ones of the timing signals. In accordance with an aspect of the invention, the step of providing provides test specifiers at a rate of (x) test specifiers per second, the step of generating generates test pin stimulus signals at a rate of (y) stimulus signals per second, and wherein $(y) = n(x)$, where (n) is an integer equal to or greater than one.

BRIEF DESCRIPTION OF THE DRAWINGS

The above set forth and other features of the invention are made more apparent in the ensuing Detailed Description of the Invention when read in conjunction with the attached Figures, wherein:

FIG. 8 depicts a plurality of format decodes for generating inter-cycle pin formats;

FIGS. 9, 10, and 11 each depicts an exemplary array coding to achieve a desired pin timing format;

FIG. 13 is a timing diagram that illustrates the effect of frequency doubling on a formatted output data string;

DETAILED DESCRIPTION OF A PREFERRED EMBODIMENT OF THE INVENTION

The following description of a presently preferred embodiment of the invention is made in the context of a true per-pin test system having an operating frequency of 250 MHZ and a test cycle period of four nanoseconds. The system includes 320 test pins expandable in increments of 320 pins, each pin including a 32 million bit pattern generation buffer memory. The test system is optimized for the testing of logic devices and embedded memory arrays through both deterministic and weighted random testing methodologies. Test pin format types supported include, but are not limited to, Non-Return to Zero (NRZ), Return to Zero (RZ), Delayed Non-Return to Zero (DNRZ), Return to One (R1) and Force One or Zero (F1/0), all of which may be changed on the fly (inter-cycle). The system further includes a plurality of timing generators per-pin, which may also be changed on the fly. The voltage range of pin drivers and receivers is $-3/+5$ volts with each pin having two receivers associated therewith. The test system is optimized for testing logic levels associated with several logic family-types and is further optimized, by including two receivers per-pin, for testing bi-directional transceiver circuits such as that disclosed in commonly assigned U.S. Pat. No. 4,698,800, issued on Oct. 6, 1987 to J. R. Cavaliere et al. It should be realized however that the teaching of the invention is applicable to a variety of per-pin architecture test systems constructed to have characteristics other than those disclosed herein.

Figure 1:
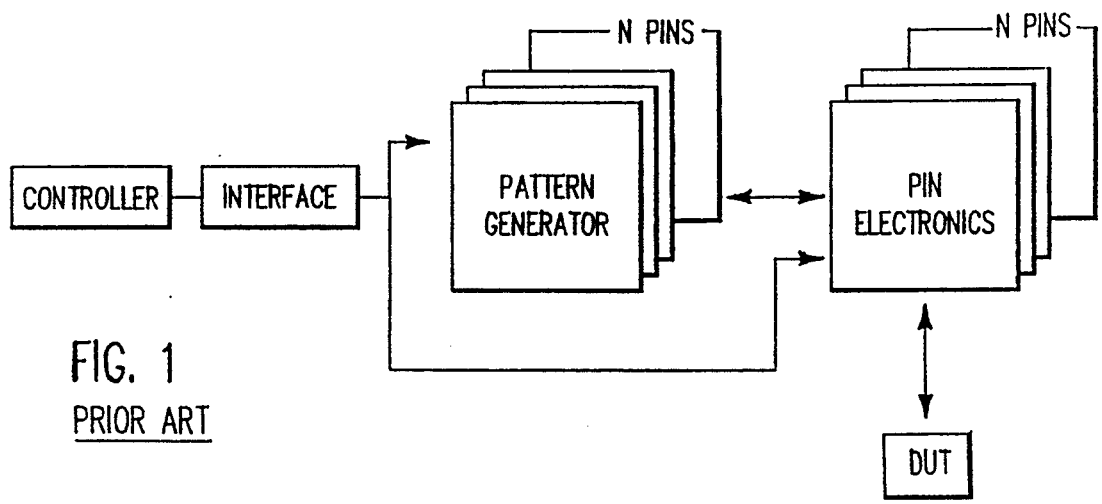
FIG. 1 is a simplified block diagram showing a per-pin test system of the prior art.
Figure 2:
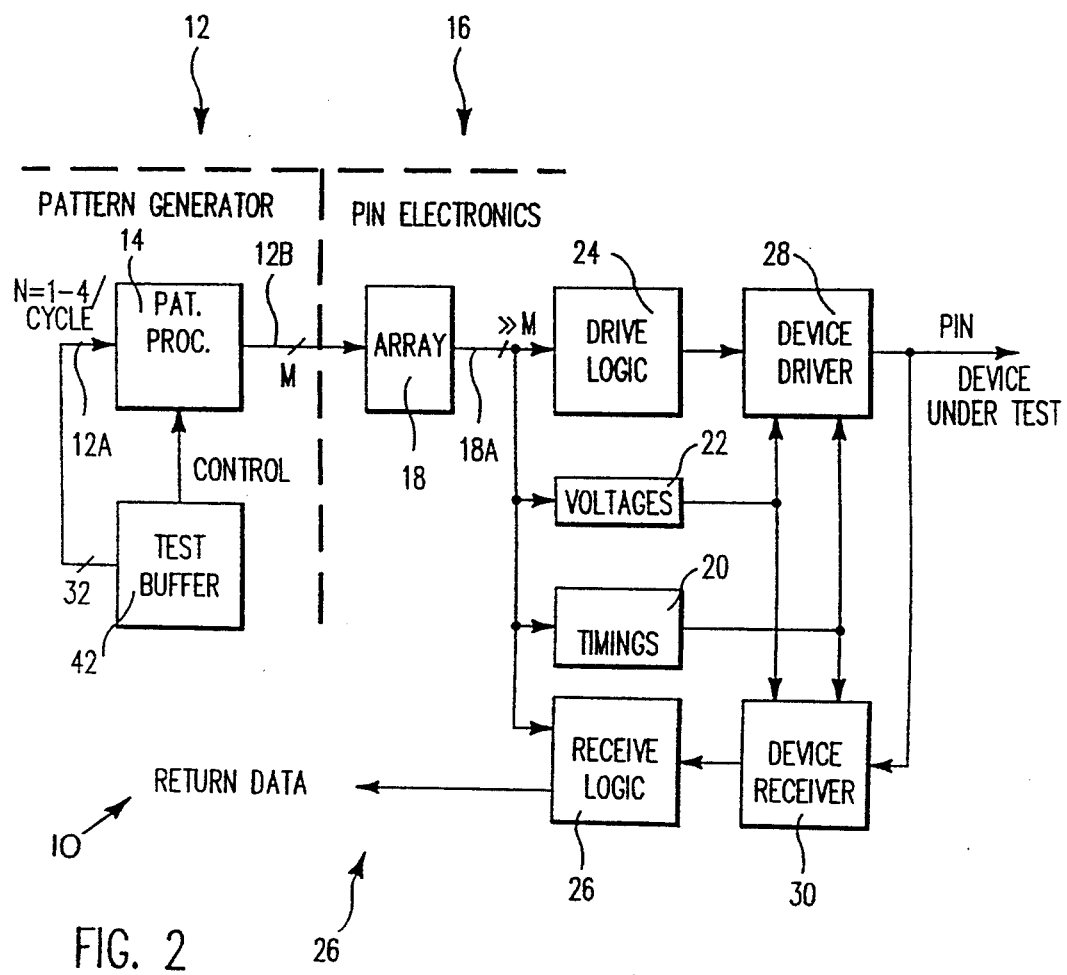
FIG. 2 is a block diagram illustrating a presently preferred embodiment of pattern generator electronics, pin electronics and the interface therebetween.

Referring to FIG. 2 there is illustrated a block diagram of circuitry 10 associated with a single test pin of a true per-pin semiconductor test system, the circuitry 10 being constructed and operated in accordance with the invention. A Test Buffer 42 supplies up to N-bits per-pin of data for every test cycle. In deterministic mode there is at least one bit used per cycle. In accordance with an aspect of the invention the actual number of N-bits is programmable with the number of bits used per test cycle being contained in pattern data stored or generated within the Pattern Generator 12. When run in the algorithmically generated mode the data is treated as commands and the number of bits used per cycle is less than 1. Control for this function is provided on a per-pin basis to maintain flexibility and independence of test pins. The Pattern 12 uses the variable number of N-bits and combines this with a set of fixed (M-N) bits to be sent to the Pin Electronics 16. A constant number of output bits (M) are sent to the Pin Electronics. In accordance with an aspect of the invention the maximum value of N determines a number of unique states that can be specified while the value of M gives an upper limit to this number of states. In a presently preferred embodiment of the invention N may equal from one to four bits while M equals four bits, although other values are within the scope of the invention. In general, as the number of bits per test cycle used by the Pattern Generator 12 increases the number of specifiable combinations also increases. Conversely, as the number of bits per test cycle is reduced the amount of memory required to specify these cycles is also decreased. In that different test applications require different amounts of DUT signal specification it is desirable to optimize the amount of specification required for a given application without expending more stored data than is necessary. As a result, the teaching of the invention makes the ratio N/M a variable, thereby providing the ability to minimize the data produced and stored in the Pattern Generator 12 while providing a required degree of DUT signal specification for a given testing application.

The M-bits comprise a per-pin interface between the Pattern Generator 12 and the Pin Electronics 16. The information conveyed by the M bits controls the Pin Electronics 16 interface to the DUT and provides the test system 10 with a per-pin, per test cycle control over pin conditions such as timing, pin formats, common I/O and comparator operations. The M bits are logically decoded to define and control the test pin condition for a given test cycle; that is, the operation and selection of timing generators, the operation of receiver comparators, the expected data processing, the pin driver's functional characteristics and other pin-related conditions. In operation, the Pin Electronics 16 includes a memory array 18 that is addressed by the M-bit interface. The array 18 produces a pin control word 18a comprised of a plurality (typically >>M) of output bits for specifying controlling values to timing units 20, controlling values to pin voltage units 22 and the drive and receive logic 24 and 26 for specifying pin formats. The array output bits 18a specify controlling bits to the drive electronics such as control for common input and output operations and a device driver 28 "on" or "off" state. In this manner the array 18 controls the desired data formats, the desired timing edge placement, the desired driver function, and the desired DUT data on a test cycle by test cycle basis. The bits of the control word 18a are also available to process the data returned from the device receivers 30 through the comparators of the receive logic 26. It can thus be realized that by initially specifying and storing the data within the array 18, it being remembered that the array 18 is associated with but a single pin of the test system, the signals produced by the Pin Electronics 16 are precisely controlled and, furthermore, the processing of data returned from the DUT to the pin is precisely defined.

Furthermore, the invention does not require that any programmable elements be dependant on outside control during normal operation, thereby releasing the system 10 to operate at an uninterrupted full speed. In contradistinction, many conventional test systems, in order to make a change in format, timing or voltage conditions of a pin driver, require that the system be placed into a wait state while the pin's condition is reprogrammed. In test programs of typical complexity such pin reprogramming occurs many times during the test program. As a result, the time delay incurred for each system wait state is incremental resulting in a significant throughput loss. The teaching of the invention advantageously eliminates the requirement that the system be placed in a wait state in that a relatively large number ($2^M$) of pin conditions can be preprogrammed into the pin electronics prior to the test, with the changes of state occurring on the fly during the test.

Figure 3:
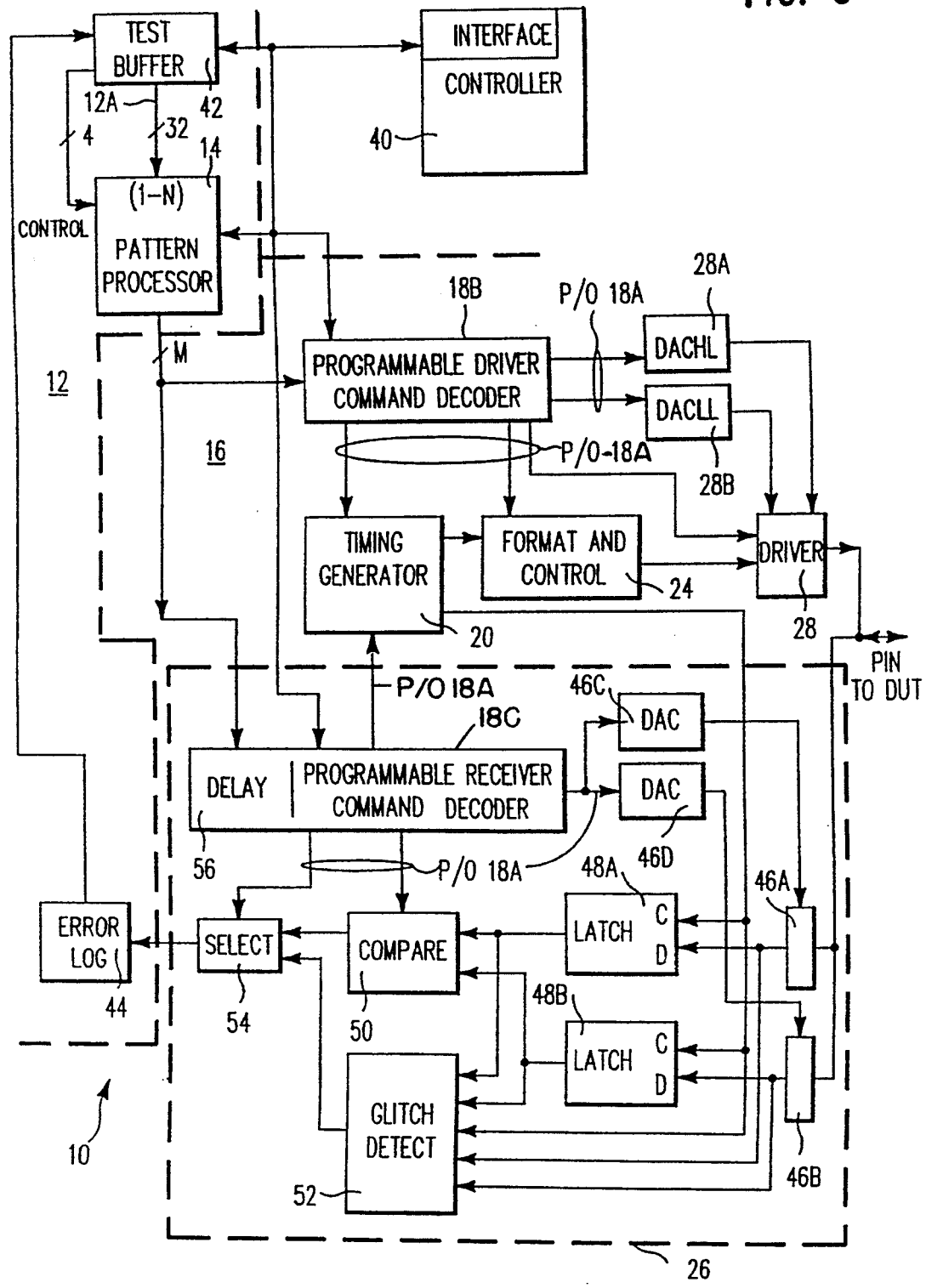
FIG. 3 is a block diagram showing in greater detail a bidirectional interface between the DUT and the test system of the invention.

Referring now to FIG. 3 there is shown in greater detail the circuitry 10 associated with one pin of the test system of the invention, specifically the Pattern Generator 12 and the Pin Electronics 16. Also shown is a controller 40 coupled at least to a test buffer 42, and the Array 18, shown in greater detail as a Programmable Driver Command Decoder 18b and a Programmable Receiver Command Decoder 18c. The controller 40 in a presently preferred embodiment of the invention is a data processor known in the art as a PS/2 processor manufactured by International Business Machines Corporation. It should be realized, however, that a number of suitable controlling devices could be so employed. The controller 40 is coupled via a suitable interface at least to the aforementioned Buffer 42, and Array 18 for storing data therein for specifying the various test cycles and the pin state for each test cycle. The interface may take the form of address and data multiplexers for providing the Controller 40 with access to these programmable elements. The Test Buffer 42 includes a 1M×36 bit DRAM block that feeds into 36 bit wide FIFO prefetch buffer. The Test Buffer 42 may further include memory-associated support circuitry such as Error Detection and Correction logic, data and address buffers, DRAM refresh control logic and similar conventional circuitry. Controller 40 writes test vector information into the Test Buffer 42 before a test and reads test-related failure information from the Buffer 42 after the test, the failure information being provided from an Error Log 44 as will be described. Controller 40 also writes appropriate data to the Array 18 for specifying pin conditions for the test. In accordance with the invention the Pattern Processor 14 also includes data format circuitry for formatting 32-bits of DRAM output into a sequentially provided series of test words of from one to four bits in width. Other bits of the 36-bits of DRAM data are used to control the above mentioned format circuitry.

That is, in this embodiment of the invention the Test Buffer 42 provides 32 bits of stored information to the Pattern Processor 14 and also provides four bits of associated CONTROL information. The 32 bits represents a minimum of eight test cycles, each test cycle thus having four bits for specifying test conditions. In accordance with an aspect of the invention the CONTROL input to the pattern processor 14 specifies up to 16 different decodings of the 32 bit input. For example, the CONTROL input may specify a code of $0_{16}$ to indicate that the 32 bits are to be divided into eight test cycles, each test cycle being represented by four bits. In this case for any one of the eight test cycles the state of the M bits may reflect the state of the corresponding N bits of the 32 bit input. A code of $1_{16}$ may indicate that the 32 bits represent 16 test cycles having two bits per cycle. In this case the Pattern Processor 14 provides two variable and two fixed bits as the M bits. Further by example another code indicates that algorithmic pattern generation is in effect and that the 32 bits are to be considered as algorithmic instructions. That is, for algorithmic processing the 32 bits are differentiated into fields with one field specifying, by example, a pin state and another field specifying a number of loops or iterations to be executed with the test pin applying the specified pin state.

As was stated, the bits 12a are appended to (M-N) fixed bits, where the number of output bits (M) determines the total number of states ($2^M$) that are available at any one pin to test the DUT. As was previously stated, in the presently preferred embodiment of the invention M equals four for specifying during a test sequence up to 16 different pin states.

The programmable timing generator 20 provides a number of timing pulses whose position can be altered in response to control signals. In a simplest embodiment the programmable timing generator 20 includes several sources of timing pulses each having an output line buffered by a multiplexor whose inputs are connected to each of the sources, while the select signals are connected to the control lines. In this manner the change of the control line status shifts the output pulses to new positions.

Another alternative for changing the timing position is to directly couple the control lines from the command decodes to the timing generators.

Aspects of the pin timing generation are described in detail below with respect to FIGS. 4–15.

The Array 18 is comprised of two sections, specifically the Programmable Driver Command Decoder 18b and the Programmable Receiver Command Decoder 18c. Decoder 18b is employed to decode the M-bit control word from pattern processor 14 to control pin driver functions while Decoder 18c decodes the same M-bit control word to control receiver functions. In a first embodiment Array 18 is a high speed RAM device where the M-bit control word is used as the address input. The width of the RAM is such that all necessary signals for controlling all pin-related functions are produced simultaneously and in parallel as the control word 18a. The depth of the RAM is less than or equal to $2^M$ and determines the maximum number of states that can be programmed for any one pin during a single test. As was stated, in the presently preferred embodiment the depth is 16 words. The Decoder 18b outputs are divided into two groups. A first group is applied to Timing Generator 20 and controls timing edge selection for driver pulse start and stop, and also a time at which to switch to a third driver state. A second group of Decoder 18b outputs drives the Format and Driver Status Control Logic 24. The information that is conveyed by this second group of output lines determines the format (RZ, NRZ, DNRZ, R1, etc.), the type of data (1,0) and whether the driver is on (drive one or drive zero) or in a third state.

The Receive Logic block 26 of FIG. 3 is indicated in dashed outline and can be seen to include a number of components. The programmable Receiver Command Decoder 18c is similar in structure to the Programmable Driver Command Decoder 18b described above but instead operates to control the status of the Receivers 46a and 46b, determine the timing to be applied to received data latches 48a and 48b, generate the expected data from the DUT for comparison with the actual DUT output by comparator 50, select a type of test (level, 'glitch' or receivers off), define a time window for a 'glitch' or transient detector 52, as well through a select multiplexer 54 to select a mode of error detection and to inhibit error logging if the pin is used as a drive pin only during this cycle.

The type of receiver preferred for the test system 10 is a high gain differential amplifier wherein the signal from the DUT is connected to a positive input and a reference voltage is connected to a negative input. The output of the amplifier is essentially a binary output (i.e. either a high or a low output). In this manner whenever the DUT output exceeds the reference voltage the output is high and when the DUT input falls below the reference the output is low.

As was previously mentioned a minimum number of Receivers 46a and 46b for an efficient test of bidirectional-type drivers is two. However, it is within the scope of the invention to provide more than two receivers if simultaneous testing of several parameters is desired. Also, under most test conditions the receiver 46a and 46b reference voltage can remain at fixed levels. However, it is within the scope of the invention to couple Digital to Analog Converter (DAC) 46c, 46d between the Programmable Receiver Command Decoder 18c and the Receivers 46a and 46b. The DACs 46c and 46d have a plurality of digital inputs coupled to a corresponding portion of the control word 18a for specifying, on a per cycle basis, the magnitude of each DAC output voltage and thus the magnitude of the associated receiver reference level. In both of the above mentioned embodiments the teaching of the invention readily accommodates the additional functionality by simply increasing the width of the RAM used for receiver decoding to generate the required additional receiver control lines.

Latches 48a and 48b capture the output state of the associated receiver 46a and 46b, respectively, at a desired strobe time. After the receiver data is captured there is sufficient time to compare in Comparator 50 the DUT signal with the expected data generated by the Programmable Receiver Command Decoder 18c. The position of the strobe is controlled by the Timing Generator 20 in response to a control signal that forms a part of the control word 18a generated by the Programmable Receiver Command Decoder 18c.

Glitch Detector 52 is employed to detect any switching activity within a predefined time window. The Glitch Detector 52 has an input (not shown) coupled to the Timing Generator 20 operates as follows. At the beginning of the window the status of each of the receivers 46a and 46b is latched. For the duration of the window the latched receiver output is compared to a time dependent output of the Receivers 46a and 46b by means of an Exclusive-Or logic function. The output of the Exclusive-Or function is employed to drive a gated set input of a set-reset latch. This gate is enabled for the duration of the window. At the end of the test cycle the status of the latch is tested and subsequently reset. If the set-reset latch is found to be set it is indicated that there occurred an excursion of the DUT signal from the state as captured at the beginning of the time window.

Further in accordance with the invention the Receiver 26 includes a Digital Delay 56 that imposes a predetermined delay on the M bit address input to the Programmable Receiver Command Decoder 18c. As a result, the receiver portion of the command word 18a is generated later in time than the driver portion of the command word 18a. The length of the delay time imposed by Digital Delay 56 is selected to compensate for signal propagation delays between the DUT and the pin electronics. In that the round trip signal propagation delay may be approximately six nanoseconds, for a typical DUT-Pin electronics spacing, while the test cycle time at 250 MHZ is only four nanoseconds, the Digital Delay 56 operates to maintain signals returned from the DUT in synchronism with the test timing.

The Error Log 44 provides a mechanism for recording the occurrence of a test cycle producing an error, that is, recording during which test cycle(s) the DUT output deviated from a predicted output. In a presently preferred embodiment Error Log 44 includes a RAM having an address that is incremented on every cycle and a corresponding RAM location written with the output of the Select Multiplexer 54. Alternately, additional logic is provided for incrementing and writing the RAM only when an error condition is indicated. The Error Log 44 contents are subsequently transferred to the memory in Test Buffer 42 and read out by the Controller 40 for off-line analysis to determine if a failure is recorded.

The Format and Control Block 24 performs pin formatting and driver control. In a first embodiment Block 24 includes a set-reset latch wherein applicable bits of control word 18a gate timing pulses to both the set and reset lines. By example, to produce a RZ (return to zero) pulse with "one" data, the logic directs a start pulse timing signal to the latch set input and an end pulse timing signal to the latch reset input. In a similar fashion all formats with one and zero data can be described and the logic necessary to accomplish the function generated. These aspects of the invention are described in greater detail below.

The Driver 28 includes two time dependent inputs. The first of these inputs determines if the Driver 28 is enabled to respond to the second input or whether the Driver 28 will remain in its third state independent of the state of the second line. The output of the Driver 28 goes to the Receivers 46a and 46b and through the pin to the DUT. In addition to the time dependent signals there are two additional control lines (not shown in FIG. 3) which determine the output high and output low voltage levels. In the presently preferred embodiment of the invention the voltage levels are predefined before the test and remain constant during the test. In other embodiments of the invention however these output high and output low voltage levels are variable on a test cycle by test cycle basis. To accomplish this additional functionality a pair of DACs, specifically a DAC High Level (DACHL) 28a and a DAC Low Level (DACLL) 28b, are coupled between the Programmable Driver Command Decoder 18b and the Driver 28. Each of the DACs 28a and 28b has a plurality of digital inputs coupled to a corresponding portion of the control word 18a for specifying, on a per cycle basis, the magnitude of the DAC output voltage. Again, the teaching of the invention readily accommodates this additional functionality by increasing the width of the RAM used for driver decoding to generate the required additional driver control lines.

As explained above, the Pattern Processor 14 reads out the required M bits/pin/cycle sequentially to execute all required test steps. However, for a general purpose tester, this implementation can impose a limitation since embedded memory array testing and LSSD logic testing require a large number of test cycles. Thus, in that embedded memory array and similar test patterns are regular in structure, they can be generated algorithmically as described at pages 26–28 in the previously mentioned journal article "250-MHZ Advanced Test Systems", IEEE Design & Test of Computers, 1988 by A. J. Gruodis and D. E. Hoffman.

The testing of LSSD shift registers further requires that some pins have the capability to provide large strings of pseudo-random data. This is a consequence of LSSD design and test generation. Tester pins requiring this capability are those coupled to LSSD Shift Register data In (SRI) and data Out (SRO) pins. For example, if for proper test of the logic X test vectors are required to be applied to the logic, and if the length of the LSSD shift register string is Y, then the SRI and SRO pins will require XY test cycles. Similarly, the LSSD shift clocks A and B require the same amount of data. However, since the clocks are repetitive, they can be generated algorithmically. In general, the same algorithmic capabilities used for address and data generation when testing memory arrays can also be used for generating the LSSD shift clocks.

Those tester pins associated, during a particular test, with LSSD functions (SRI, SRO, shift clocks A and B) as mentioned above require a substantial amount of data during the test. However, there is no requirement for the format nor the timing to change from cycle to cycle in that the test involves loading and clocking the LSSD shift register. For this reason the tester of the invention stores or generates only one bit of data per test cycle to be used to drive the LSSD associated test pins. The remaining, unused lines of the M bits at the output of Pattern Processor 14 can be forced to a fixed, or inactive, state. In this manner no physical change is required in the Decoders 18b and 18c driven by the M bits, yet the amount of control word 18 related data required to be stored before the test by the Controller 40 within the Decoders 18b and 18c is decreased significantly.

It can be seen that the invention provides in a per-pin semiconductor test system, having a plurality of test pins expressed as ($P_{total}$), circuitry coupled to each test pin for providing the system with a total possible number of test pin conditions given by ($2^M)^{Ptotal}$)), wherein M is an integer and is expressive of a number of active interconnects coupled between the test pin pattern generator and the test pin driver/receiver electronics. For example, assuming a pin complement of 1024 the resulting number of specifiable pin conditions is $16^{1024}$ based on M being equal to four active signal interconnects. For the case described above wherein only one of the M interface lines is active, such as when performing algorithmic testing, the number of specifiable system pin conditions is $2^{1024}$.

Additional functionality of the test system is now described with reference to FIGS. 4-15.

In accordance with the teaching of the invention, an ability to couple more than one timing generator to the format generator is provided. Alternatively, a timing generator is employed that produces more than one pulse per pattern generator cycle, i.e. runs at a higher frequency. In this manner, when a multiplicity of timing edges are applied to the Format Generator 24, specifically to set and reset inputs thereof, a multiplicity of pulses are generated to the DUT for every cycle of the Pattern Processor 14. When the system is used to effectively double the test pin speed, each Receiver 46a and 46b is used to monitor a different portion of the Pattern Processor 14 cycle.

In that two or more pulses may be produced during every cycle, for proper control of these pulses at least two bits of information, i.e., four or more different states of 1's and 0's are employed. In that the pin electronics can decode 16 different words, using the 4-bit input from the Pattern Processor 14, each of the 16 different words may be partitioned into four groups. Each group has the required states of 1's and 0's, and different groups are used for different formats/timings.

Figure 4:
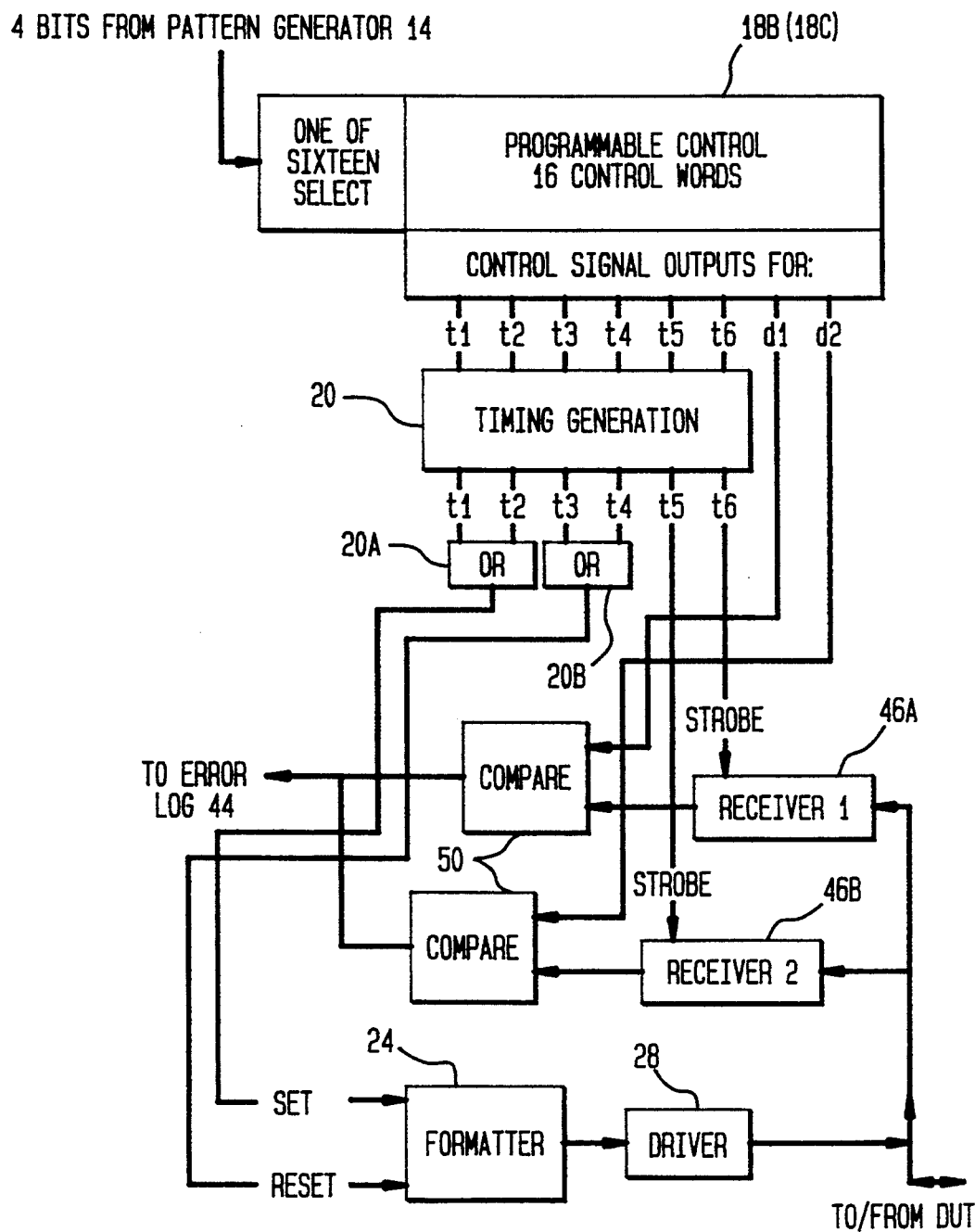
FIG. 4 is a block diagram illustrating an embodiment of pin driver/receiver timing generation logic.

In greater detail, and as is shown in the illustrative embodiment of FIG. 4, the programmable control (18B, 18C) produces the control bus 18A for each of the timing pulses. This control includes an on/off signal and information to adjust the position of the timing pulse. Also shown in FIG. 4 are two receiver strobes (t5, t6), and the data expected from the DUT (d1 and d2) that drives the receivers 46A, 46B, and also the receiver comparators 50.

Different formats are achieved by controlling four format related timing generators (t1, t2, t3, t4). For a return to zero (RZ) mode all four timing edges are used. To produce '00', t1 and t2 are turned off. To produce '01', t1 is turned off while t2 is on, etc. In the NRZ mode t1 and t3 are aligned at 'zero' time, or at the desired delay position; and t2 and t4 are aligned at a mid-point of the test cycle, or are aligned during the second half of the test cycle by a same amount as t1 and t3 are offset away from time 'zero'. To produce a '1' in either half, or both halves, of the test cycle, t1 or t2, or both, are turned on. To produce a '0' in either half of the test cycle either t3 or t4, or both, are turned on. In a similar manner other formats are produced, as is described in detail below.

As a result of the timing control described above, a pattern generator having a maximum pattern rate of (x) cycles/second is enabled to control pin electronics to operate at (y) cycles/second, where y=2x. For the presently preferred embodiment, Pattern Processor 14 provides patterns at a 250 MHz rate, and the pin electronics drives the test pin at an effective 500 MHz rate. This is referred to herein as frequency doubling.

Figure 5:
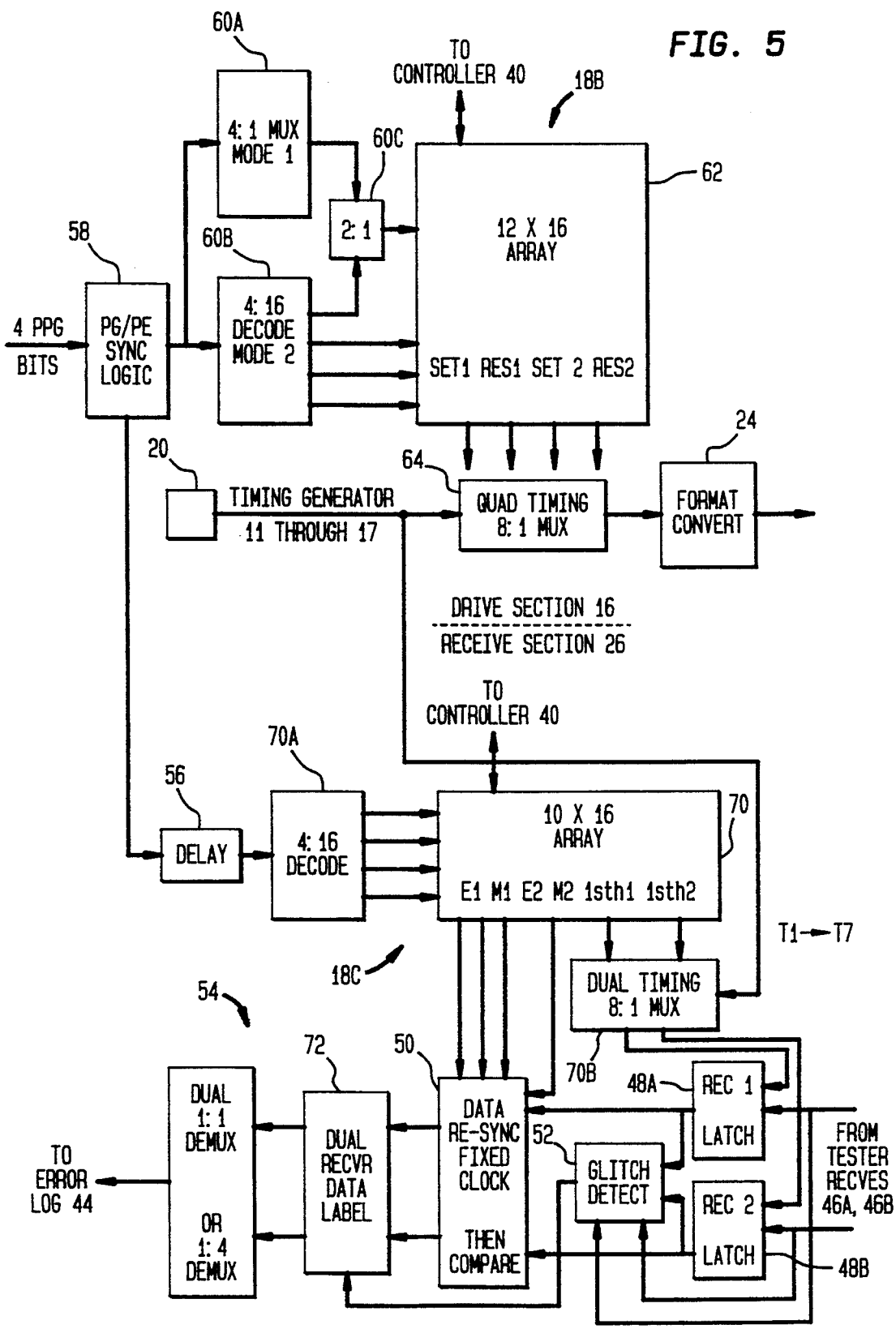
FIG. 5 is a block diagram illustrating a second embodiment of pin driver/receiver timing generation logic.

FIG. 5 is a block diagram showing in greater detail a presently preferred embodiment of the driver and receiver logic. It should be realized that significant portions of the logic shown may be combined into one or more integrated circuits to achieve a reduction in physical size and an increase in operating speed.

The four control bits from the Pattern Processor 14 are applied to Synchronization (SYNC) Logic 58, MUXes 60A, 60B, and 60C, and are latched in an Array 62 in the pin electronics. After reception, the four bits are used to address the Array 62. For each tester cycle, one of 16 ($2^4$) possible test cases, per pin, is specified. Each test case allows control of the Data format (NRZ, RZ, etc.), Timing edge placement, and Driver 28 data.

Figure 7:
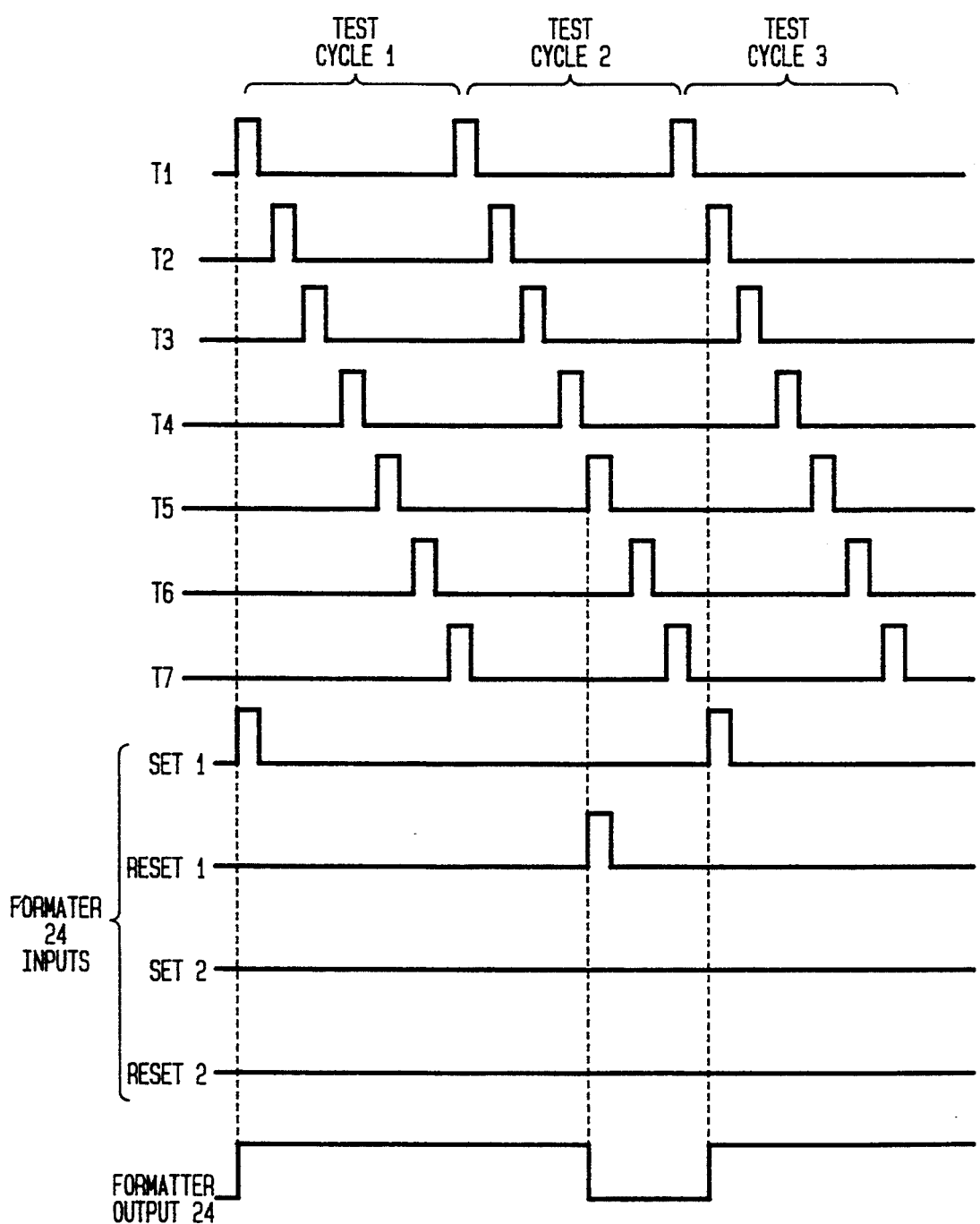
FIG. 7 is a timing diagram showing inter-cycle timing edge changes.

The system of the invention operates to build an output waveform timing edge placement and format from the control bits that are stored in the Array 62. The Array 62 is coupled to the Controller 40 for being loaded thereby with up to 16 words specifying timing control information. For this embodiment, the Array 62 is a memory device that is 16 words deep, with each word having a width of 12-bits. Also for this embodiment, the Timing Generator 20 sequentially generates, per test cycle, seven timing pulses (T1-T7), as shown in FIG. 7. Each driver test case is controlled by a selected one of the 12-bit words output from the Array 62. The 12-bits are partitioned into four sets of three bits as follows:

set 1—Timing selection for Formatter 24 Set Input #1 (Set1), set 2—Timing selection for Formatter 24 Reset Input #1 (Res1), set 3—Timing selection for Formatter 24 Set Input #2 (Set2), and set 4—Timing selection for Formatter 24 Reset Input #2 (Res2).

Figure 6:
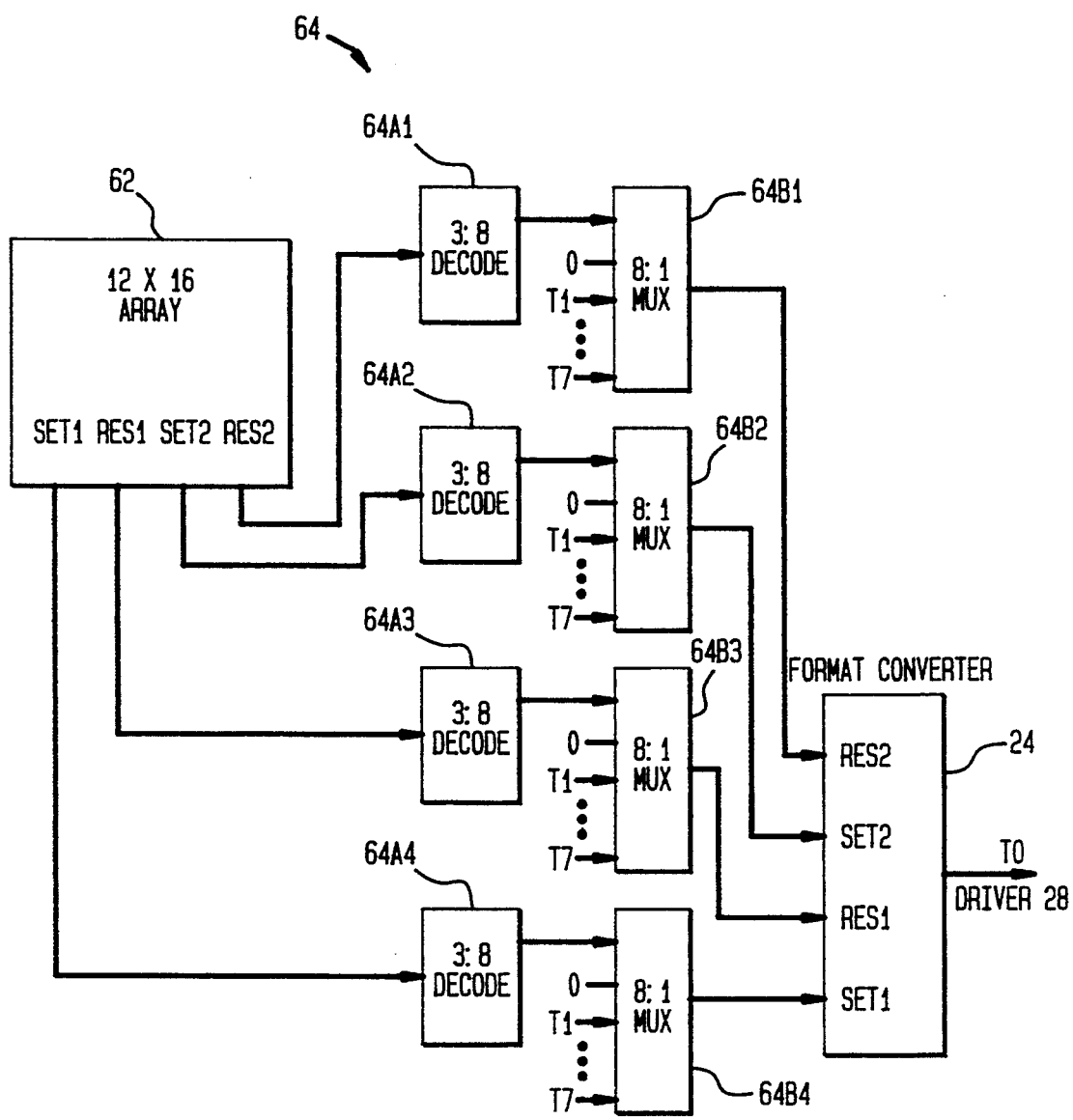
FIG. 6 is block diagram illustrating in greater detail pin timing state decoder circuitry.

FIG. 6 illustrates an embodiment of the invention wherein each of the four sets of three timing selection bits are applied to a timing selector 64. Timing selector 64 includes four 3:8 Decoders 64A1-64A4. The Decoders 64A1-64A4 generate a decode address for four independent 8:1 multiplexers 64B1-64B2. The 3-bit timing selection outputs from Decoders 64A1-64A4 select one of the seven per-pin timing signals (T1-T7) that are common inputs to all four of the 8:1 multiplexers (64B1-64B2). A first Decoder selection (000) is a decode for a static level (0) used to inhibit a particular Formatter 24 set or reset input.

After the MUX 64B1-64B2 selection is made, a specified one of the seven timing edges (T1-T7) passes through the MUXes 64B1-64B2 and clocks one of the set inputs or one of the reset inputs of the Formatter 24. By changing the Array 62 timing selection bits, and thus the MUX 64B1-64B2 decoded addresses, different combinations of timing generator edges pass through the MUXes 64B1-64B4. This generates a timing change, during a selected test cycle, to the Formatter 24. By sequencing through different combinations in the Array 62, timing on the fly, that is, inter-cycle timing changes, are realized.

FIG. 7 is a timing diagram depicting an example wherein a timing edge is changed once during cycle 1 (T1), once during cycle 2 (T5), and once during cycle 3 (T2).

In a presently preferred embodiment of the invention, the Formatter 24 is logically equivalent to a set/reset flip-flop. To create multiple waveform types, two set inputs (Set1, Set2) and two reset inputs (Res1, Res2) are provided. This enables up to four different driver edges to control the Formatter 24 during a single cycle. The waveform format of the Formatter 24 output is a function of which ones of the four set/reset inputs are activated by the Array 62. It should now be apparent that the enabling or disabling of timing selections within a word of a particular Array 62 combination creates format on the fly changes.

FIG. 8 illustrates various programing combinations of the Array 62 to create a number of different output waveform formats. By employing the four Formatter 24 inputs (Set1, Set2, Res1, Res2) and the inhibit (INH), the following formats, and combinations of formats, may be generated from, by example, timing signals T1-T4:

| | |
|---|---|
| NRZ | Non return to zero, |
| NRZ1 | Non return to zero inverted, |
| RZ | Return to zero, |
| DRZ | Delayed return to zero, |
| R1 | Return to one, |
| DR1 | Delayed return to one, |
| DRNZ | Delayed NRZ, |
| DNRZ1 | Delayed NRZ inverted, |
| F1 | Force one, |
| F0 | Force zero, |
| SBC | Surround by complement, |
| SBCI | Surround by complement inverted, |
| DP | Double pulsing within one cycle; and |
| DDP | Delayed double pulse. |

For example, an exemplary Array 62 coding to create a four cycle pattern of NRZ(0), RZ(3ns), RZ(5ns), R1(3ns) is shown in FIG. 9. It should be noted that both the Set2 and Res2 inputs to the Formatter 24 are deactivated by selecting the 000 Array 62 location, which is a non-controlling static level (INH) having no effect on the Formatter 24 output. These four words represent four out of 16 possible desired combinations. It should also be noted in cycle 2-3, the output pulse width has a timing on the fly change, and in cycles 1-2 and 3-4, the format is changed on the fly.

Due to the flexibility in building output waveforms from a control table of timing selection bits, the use of the invention provides for a large number of waveform formats to be generated. Furthermore, and in accordance with an aspect of the invention, the formatted output waveform may be defined in such a manner as to effectively double the output frequency of the Formatter 24.

Figure 12A:
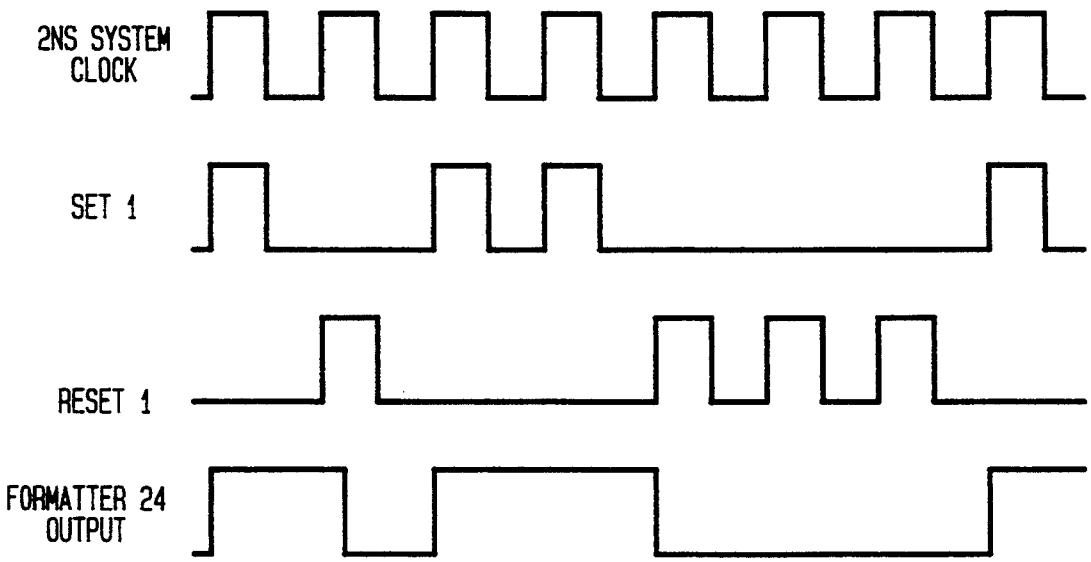
FIGS. 12A and 12B are timing diagrams that illustrate the effect of driver pin frequency doubling.

By example, the case is considered where a waveform is defined in the Array 62 to create an NRZ pattern of 10110001, as shown in FIGS. 10 and 12A. The four control bits (or Array 62 addresses) from the Pattern Processor 14 cycle through the Array 62 eight times in a sequence selected for generating the desired NRZ serial data stream to the test pin.

However, by adding two, additional Array 62 cases, as shown in FIG. 11, the desired frequency doubling occurs for a test sequence that is #3, #1, #2, and #4. The formatted pin data, in the correct order, appears as if the output frequency is doubled, in that two transitions per cycle are each considered as NRZ data for each individual transition.

Figure 12B:
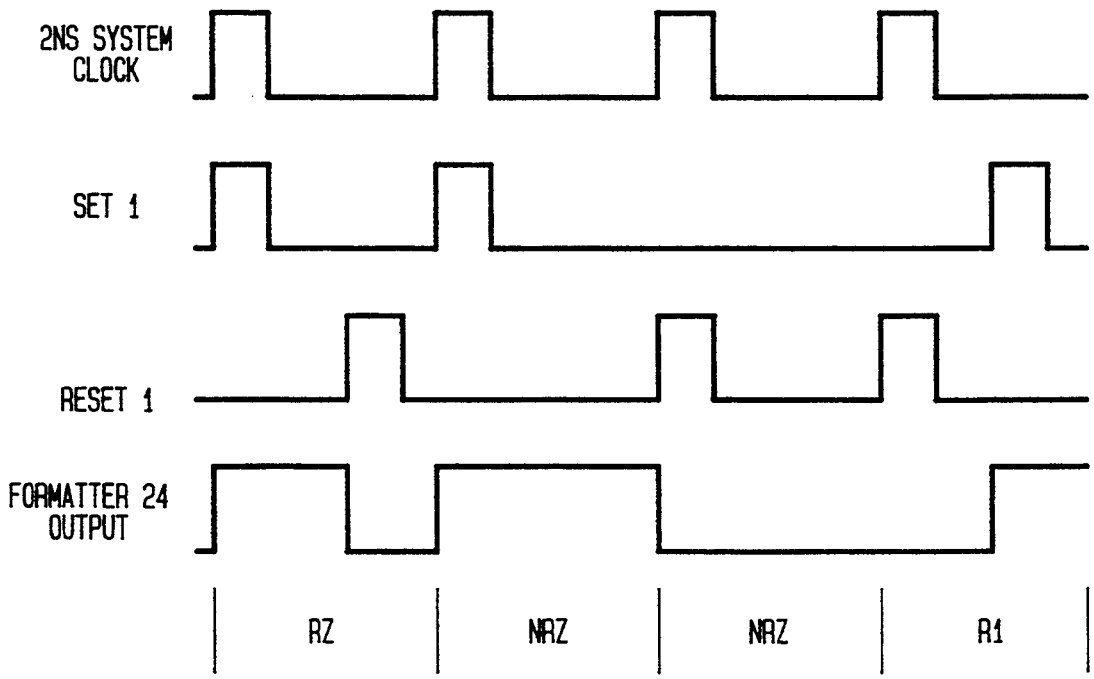

The result of this waveform doubling is shown in the timing diagram of FIGS. 12A and 12B. FIG. 12A shows the output with a tester running at a two nanosecond SYSTEM CLOCK rate. FIG. 12B shows that the same Formatter 24 output can result by running the tester at half of this rate, i.e., at four nanosecond SYSTEM CLOCK rate. Thus, 500 MHz-like waveforms are generated by running the Pattern Processor 14 and the Timing Generator 20 at 250 MHz.

If the desired output waveform to be doubled is not NRZ, implying formatted data, all four Formatter 24 inputs are used. As is shown in FIG. 13, formatted data of a type represented by two clocks, i.e. RZ or R1, employs four clocks to create the desired 10110001 double formatted rate.

In the receive mode, the tester receives responses from the DUT through Receivers 46A, 46B, and then through the comparators 50 of FIG. 4. These results are processed for failure conditions. Upon completion of the analysis, the processed information is provided to the Pattern Generator 12 for error logging.

As seen in FIG. 5, the Receiver 26 includes a 10 bit by 16 word deep Array 70. The four bits output from the Pattern Processor 14 also address Array 70 via a 4:16 Decoder 70A. However, the four bits are delayed in time by the aforementioned Delay 56 to compensate for the tester drive path delays (Formatter 24 and Driver 28) and for a delay introduced by a transmission line link to the DUT.

Bits D0-D2 and D3-D5 contain the control (or multiplexer decode address) for the timing selection of strobes TStb1 and TStb2, respectively. These two strobes are chosen from the set of seven per pin timing generators (T1-T7) and are applied to Receiver latches 48A and 48B to latch the outputs of Receivers 46A and 46B, respectively. Timing selection logic (70B, 70C) is identical to the multiplexer structures (64) employed in the Formatter 24 selection (FIG. 6), and includes a 3:8 Decoder 70C (FIG. 14).

Figure 14:
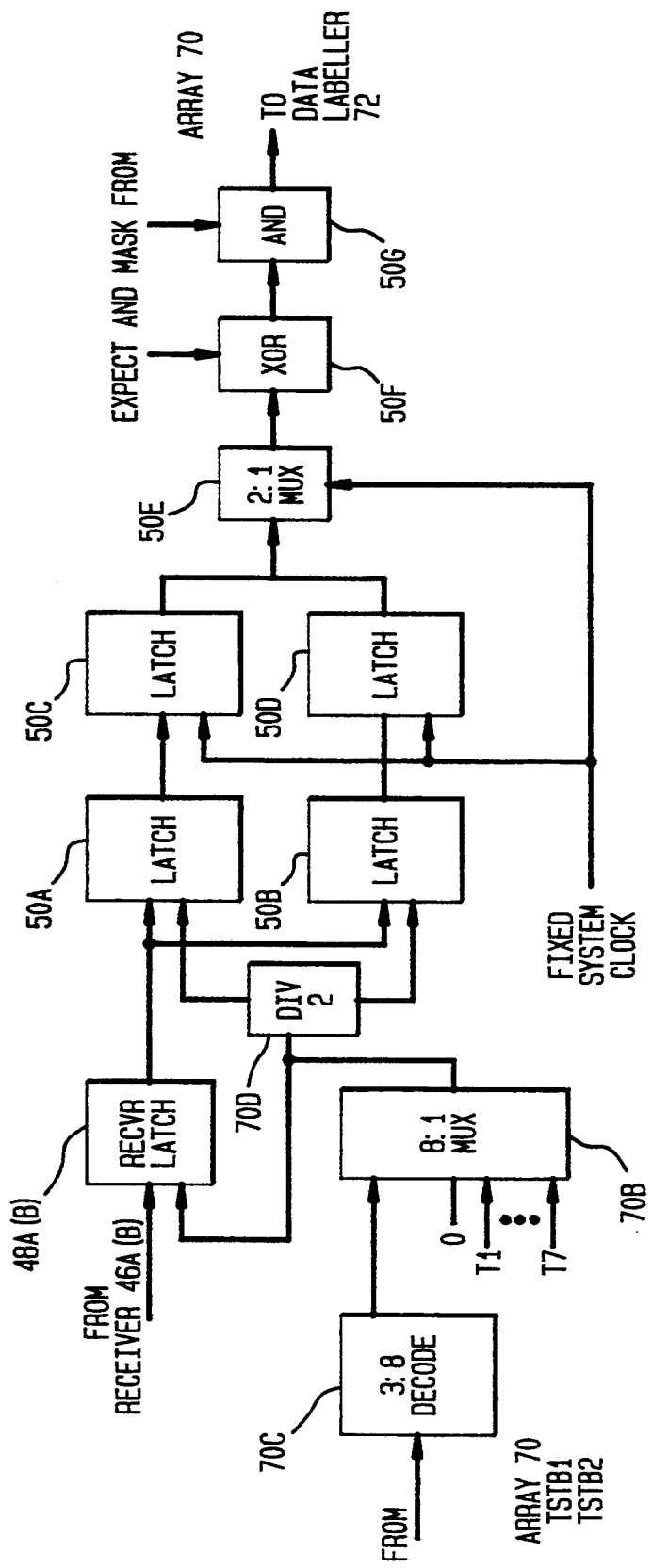
FIG. 14 is a block diagram showing pin receiver synchronization and comparison logic.

FIG. 14 illustrates the resynchronization and comparison logic 50 of FIG. 5, specifically, one channel thereof. As can be seen, after the two timing selections are specified, the resultant clocks output by MUX 70B strobe the Receiver Latch (48A or 48B) to latch results from the DUT. The latched results are compared with an expected response to determine failure conditions. The expected results are stored in the Array 70 as a set of four bits, in accordance with:

| | |
|---|---|
| Bit 1 | Comparator 1 expect (E1), |
| Bit 2 | Comparator 1 mask (M1), |
| Bit 3 | Comparator 2 expect (E2), and |
| Bit 4 | Comparator 2 mask (M2). |

Before the results are compared (or masked off) to an expected state, the latched data is resynchronized to the Array 70 output. That is, in that the inputs to the latches can be skewed in time, and may cause false detection of glitches when logically exclusive OR'ed (ANDed for masking) with the Array 70 data, resynchronization logic is included with the Comparator 50 logic.

The output of the Receiver Latch 48A(B) is latched first with a divide by two Tstb selected clock generated by divider 70D. The output of divider 70D strobes Latches 50A and 50B. The outputs of Latches 50A and 50B are applied to Latches 50C and 50D, respectively, which are clocked with a fixed System clock. With the period of the data now effectively doubled, the fixed System clock, via 2:1 MUX 50E, combines the outputs of Latches 50C and 50D once again into a serial data stream. This serial data stream is synchronized to the tester clock.

The output of MUX 50E is then exclusive OR'ed (50F) with the Expected data state at the addressed location in the Array 70. An AND gate 50G is employed, if desired, to mask the serial data stream output from XOR 50F, again in accordance with the Mask bit output from the Array 70.

In that the Expect/Mask bits output from Array 70 determine the expected DUT response, the result of each comparator 50 is sent back to the Pattern Generator 12 for storage. For those cases where additional DUT output waveform analysis is desired, the result of the comparators 50 is returned to the Pattern Generator 12 in conjunction with an identifying label applied by Dual Receiver Data Label block 72.

Figure 15:
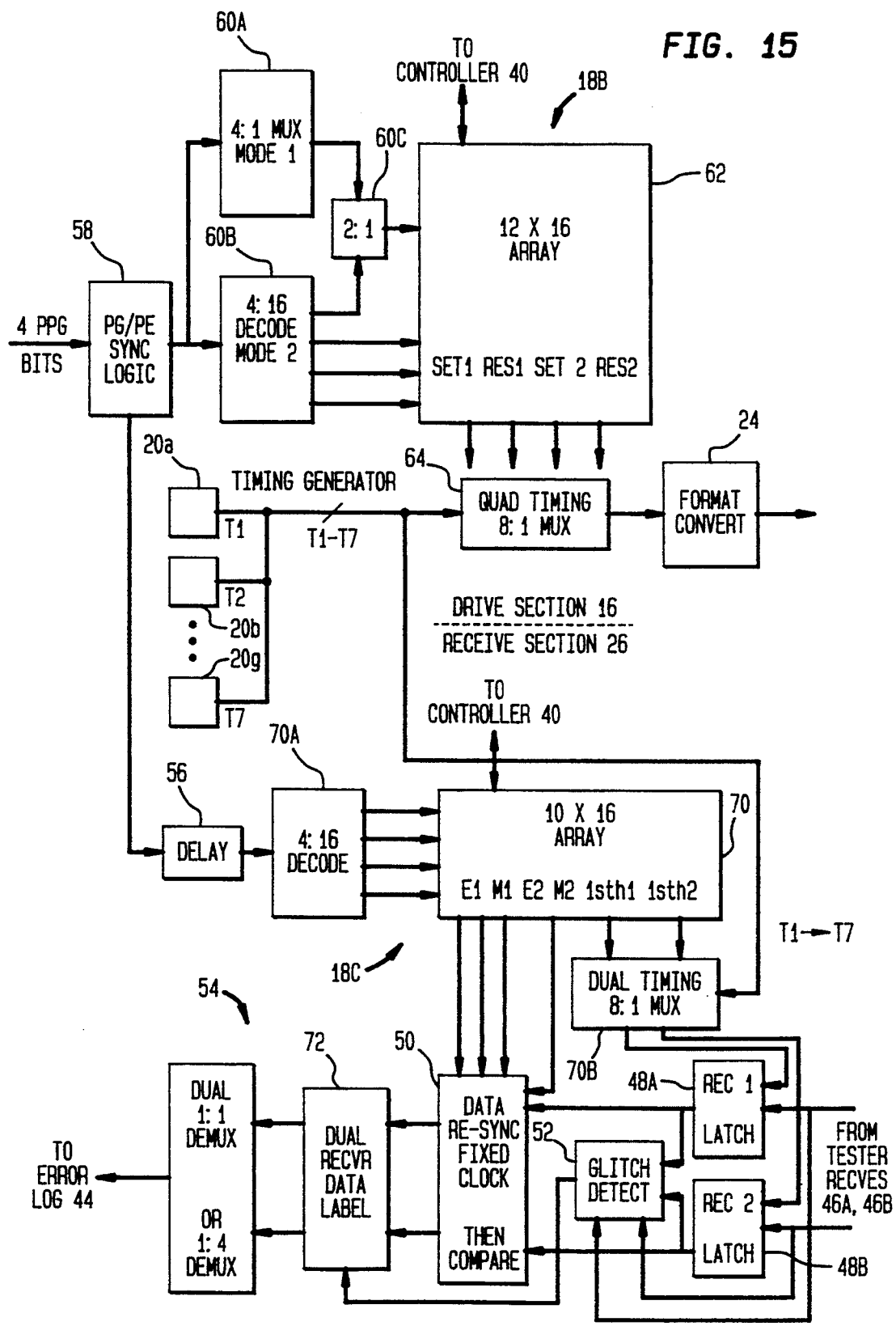
FIG. 15 is a block diagram illustrating a further embodiment of the invention that employs a plurality of timing generators for providing inputs to a timing selector.

FIG. 15 is a block diagram illustrating a second embodiment of the invention. In FIG. 15 components numbered as in FIG. 5 function as described above. As can be seen, this embodiment of the invention employs seven timing generators (20a-20g), each of which generates one of the timing signals T1-T7 as shown in FIG. 7.

The invention has been described in the context of presently preferred embodiments thereof. It should be apparent, however, that modifications to these embodiments may occur to those having skill in the art. For example, it is within the scope of the invention to store and output more or less than the 12-bits and the 10-bits from Array 62 and Array 70, respectively. Also, other waveform formats, or combinations of waveform formats, than those explicitly disclosed above may be specified and generated. Furthermore, the Timing Generator 20 or Timing Generators 20a-20g may provide more or less than seven discrete timing signals (T1-T7) during a test cycle. Similarly, the Timing Selector 64 and Formatter 24 may be arranged so as to enable frequency tripling or quadrupling at the test pin, by specifying more than four edges or transitions output by the Timing Generator 20, and by providing the Format Converter with more than two set inputs and two reset inputs. In like manner, three receiver circuits may be employed to receive a frequency tripled response from the DUT, and four receiver circuits may be employed to receive a frequency quadrupled response from the DUT.

In summary, the teaching of the invention provides a test system wherein a storage device or a pattern processor outputs test specifier data at a rate of (x) specifiers per second, wherein the Formatter generates stimulus signals at a rate of (y) stimulus signals per second, and wherein (y)=n(x), where (n) is an integer equal to or greater than one.

Thus, while the invention has been particularly shown and described with respect to preferred embodiments thereof, it will be understood by those skilled in the art that changes in form and details may be made therein without departing from the scope and spirit of the invention.

Having thus described our invention, what we claim as new, and desire to secure by Letters Patent is:

1. A test system having a plurality of test pins, for each of the test pins the system comprising:

pattern processor means having an output for outputting a test pattern for each one of a plurality of test cycles, each of the test patterns being comprised of M bits;

first decoding means, having an input coupled to the output of the pattern processor means, for decoding one of the M-bit test patterns into one of the $2^M$ control words, said first decoding means having an output for outputting said control word as a first plurality of bits;

timing generator means having an output for providing, during a test cycle, a plurality of timing signals;

waveform generator means having an output coupled to a test pin, a first input coupled to said output of said first decoding means and a second input coupled to said output of said timing generator means, said waveform generator means being responsive to said first plurality of bits and to said plurality of timing signals for selecting, in accordance with information specified by said first plurality of bits, specified ones of said timing signals for generating a stimulus signal at the test pin;

second decoding means, having an input coupled to said output of the pattern processor means, for decoding each of the M-bit test patterns into one of $2^M$ control words, said second decoding means having an output for outputting said control word as a second plurality of bits; and comparator means including signal latching means having an input coupled to the test pin, said comparator means having a first input coupled to said output of said second decoding means and a second input coupled to said output of said timing generator means, said comparator means being responsive to said second plurality of bits and to said plurality of timing signals for selecting, in accordance with information specified by said second plurality of bits, a specified one or ones of said timing signals for causing said signal latching means to latch a signal received from the test pin, said comparator means further including means for comparing the latched signal to an expected signal, the expected signal being expressed as one or more of said plurality of bits.

2. A test system as set forth in claim 1 wherein said first plurality of bits are grouped into a plurality of multi-bit sets, wherein said waveform generator means includes a plurality of decoder means, wherein one of said decoder means has an input coupled to one of said multi-bit sets for decoding said bits, and wherein said waveform generator means further includes a plurality of multiplexer means individual ones of which each have a plurality of inputs coupled to said plurality of timing signals and which further have a control input coupled to an output of an associated one of said decoder means, for providing at an output of said multiplexer means one of said timing signals that is specified by the output of said associated decoder means.

3. A test system as set forth in claim 2 wherein said waveform generator means further includes set/rest flip-flop means having a plurality of set inputs at least one of which is coupled to individual ones of a first plurality of said multiplexer means outputs, said set/rest flip-flop means further including a plurality of reset inputs, at least one of said reset inputs is coupled to individual ones of a second plurality of said multiplexer means outputs, wherein an output of said set/reset flip-flop means changes state in accordance with said outputs of said plurality of multiplexer means, said output of said set/reset flip-flop means being coupled to the test pin.

4. A test system as set forth in claim 1 and further comprising:
storage means for storing information specifying the operation of a test pin for individual ones of a plurality of test cycles, said pattern processor means having an input coupled to an output of the storage means and, responsive to stored information output from the storage means, outputting the M-bit test pattern in accordance with the stored information.

5. A test system as set forth in claim 1 and further including delay means, interposed between the input of said second decoding means and the output of said pattern processor means, for delaying the receipt of the M-bit test pattern by the second decoding means, with respect to the receipt of the M-bit test pattern by the first decoding means, by a period of time sufficient to accommodate at least a response time of a device that is coupled to the test pin.

6. A test system as set forth in claim 1 and further comprising:
storage means for storing information specifying the operation of a test pin for individual ones of a plurality of test cycles, said pattern processor means having an input coupled to an output of the storage means, and responsive to stored information output from the storage means, outputting the M-bit test pattern in accordance with the stored information; and
control means having an output coupled to an input of said storage means, to an input of said pattern processor means, to an input of said first decoding means, and to an input of said second decoding means, for controlling the flow of information prior to the execution of test cycles by the test system.

7. A test system as set forth in claim 1 wherein said waveform generator means is responsive to said first plurality of bits generated by said first decoding means for generating, during a single test cycle, one or more test pin waveform formats selected from the group consisting essentially of:

| | |
|---|---|
| NRZ | Non return to zero, |
| NRZI | Non return to zero inverted, |
| RZ | Return to zero, |
| DRZ | Return to zero inverted, |
| R1 | Return to one, |
| DR1 | Return to one inverted, |
| DNRZ | Delayed NRZ, |
| DNRZI | Delayed NRZ inverted, |
| F1 | Force one, |
| F0 | Force zero, |
| SBC | Surround by complement, |
| SBCI | Surround by complement inverted, |
| DP | Double pulsing within one cycle, |
| DDP | Delayed double pulse, and | combinations thereof.

8. A test system as set forth in claim 1 wherein said pattern processor means outputs the M-bit test patterns at a rate of (x) test patterns per second, wherein said waveform generator means generates stimulus signals at a rate of (y) stimulus signals per second, and wherein (y)=n(x), where (n) is an integer equal to or greater than one.

9. A test system as set forth in claim 1 wherein said signal latching means includes means for synchronizing the received signal to the operation of the test system.

10. A test system as set forth in claim 1 wherein said comparator means further includes means for selectively masking a result of the comparison in accordance with a mask specified by one or more of said second plurality of bits.

11. A method for operating a test system having a plurality of test pins, for each of the test pins the method comprising the steps of:
sequentially generating individual ones of a plurality of timing signals during a test cycle;
providing a test pattern comprised of M bits;
decoding the M bits into one of $2^M$ first multi-bit control words;
selecting specified ones of the timing signals in accordance with logical states of bits of a first multi-bit control word;
generating a stimulus signal at a test pin in accordance with the selected specified ones of the timing signals;
decoding the M-bits into one of $2^M$ second multi-bit control words;
selecting one or more of the timing signals in accordance with logical states of bits of the second multi-bit control word, the selected timing signal or timing signals each being employed to latch a signal appearing on the test pin; and
comparing the latched signal to an expected signal that is specified by one or more bits of the second multi-bit control word.

12. A method as set forth in claim 11 wherein the step of generating generates, during a single test cycle, one or more test pin formats selected from the group consisting essentially of:

| | |
|---|---|
| NRZ | Non return to zero, |
| NRZI | Non return to zero inverted, |

| | |
|---|---|
| RZ | Return to zero, |
| DRZ | Return to zero inverted, |
| R1 | Return to one, |
| DR1 | Return to one inverted, |
| DNRZ | Delayed NRZ, |
| DNRZI | Delayed NRZ inverted, |
| F1 | Force one, |
| F0 | Force zero, |
| SBC | Surround by complement, |
| SBCI | Surround by complement inverted, |
| DP | Double pulsing within one cycle, |
| DDP | Delayed double pulse, and | combinations thereof.

13. A method as set forth in claim 11 wherein the step of providing provides test patterns at a rate of (x) test patterns per second, wherein the step of generating generates test pin stimulus signals at a rate of (y) stimulus signals per second, and wherein (y)=n(x), where (n) is an integer equal to or greater than one.

14. A method as set forth in claim 11 and further including a step of selectively masking a result of the comparison, the mask being specified by one or more bits of the second multi-bit control word.

15. A method as set forth in claim 11 wherein the step of decoding the M bits into one of $2^M$ second multi-bit control words includes an initial step of delaying a receipt of the M-bit word by a period of time sufficient to accommodate at least a response time of a device that is coupled to the test pin.

16. A method for operating a test system having a plurality of test pins, for each of the test pins the method comprising the steps of:

generating in a sequential manner, during a single test cycle, individual ones of a plurality of timing signals such that each of the timing signals makes a first transition a predetermined period of time after a preceding timing signal makes a first transition;

providing a test pattern comprised of M-bits;

decoding the M-bits into one of $2^M$ multi-bit control words;

selecting specified ones of the timing signals, during the single test cycle, in accordance with logical states of bits of the multi-bit control word; and generating, during the single test cycle and in accordance with a transition of each of the selected specified ones of the timing signals, at least two test pin waveform formats.

17. A method as set forth in claim 16 wherein the at least two test pin waveform formats are selected from the group consisting essentially of:

| | |
|---|---|
| NRZ | Non return to zero, |
| NRZI | Non return to zero inverted, |
| RZ | Return to zero, |
| DRZ | Return to zero inverted, |
| R1 | Return to one, |
| DR1 | Return to one inverted, |
| DNRZ | Delayed NRZ, |
| DNRZI | Delayed NRZ inverted, |
| F1 | Force one, |
| F0 | Force zero, |
| SBC | Surround by complement, |
| SBCI | Surround by complement inverted, |
| DP | Double pulsing within one cycle, |
| DDP | Delayed double pulse, and | combinations thereof.

18. A method as set forth in claim 16 wherein the step of providing provides test patterns at a rate of (x) test patterns per second, wherein the step of generating generates test pin stimulus signals at a rate of (y) stimulus signals per second, and wherein (y)=n(x), where (n) is an integer equal to or greater than one.

19. A per-pin test system having a plurality of test pins, for each of the test pins the system comprising:

timing signal means having an output for providing in a sequential manner, during a single test cycle, a plurality of timing signals, each of the timing signals making a first transition a predetermined period of time after a preceding timing signal makes a first transition;

pattern processor means having an output for providing, for a test cycle, a test pattern comprised of M bits;

decoding means having an input coupled to the output of a providing means for decoding the M-bits into one of $2^M$ multi-bit control words;

selecting means, having an input coupled to the decoding means and an input coupled to the output of the timing signal generating means, for selecting, during the single test cycle and in accordance with logical states of bits of the multi-bit control word, specified ones of the timing signals; and generating means having an input coupled to the selecting means for generating (p) test pin waveform formats during the single test cycle in accordance with a transition of each of the selected specified ones of the timing signals, wherein (p) is equal to or greater than two.

20. A system as set forth in claim 19 wherein the providing means provides test patterns at a rate of (x) test patterns per second, wherein the generating means generates test pin stimulus signals at a rate of (y) stimulus signals per second, and wherein (y)=n(x), where (n) is an integer equal to or greater than two.

21. A system as set forth in claim 20 and further including, for each of the test pins:

second means, having an input coupled to the output of the providing means, for decoding the M-bits into one of $2^M$ multi-bit second control words;

(n) receiver means each of which has an input coupled to the test pin and an output; and (n) comparator means each of which has an input coupled to the second decoding means, an input coupled to the timing signal generating means, and an input coupled to said output of an associated one of said (n) receiver means, each of said (n) comparator means including means for selecting, in accordance with information specified by the output of the second decoding means, a specified one of said timing signals for latching a signal output by said associated one of said (n) receiver means, each of said (n) comparator means further including means for comparing the latched signal to an expected signal, the expected signal being expressed as one or more bits of the second control word.

22. A system as set forth in claim 19 wherein the (p) test pin waveform formats are selected from the group consisting essentially of:

| | |
|---|---|
| NRZ | Non return to zero, |
| NRZI | Non return to zero inverted, |
| RZ | Return to zero, |
| DRZ | Return to zero inverted, |
| R1 | Return to one, |
| DR1 | Return to one inverted, |
| DNRZ | Delayed NRZ, |

-continued

| | |
|---|---|
| DNRZI | Delayed NRZ inverted, |
| F1 | Force one, |
| F0 | Force zero, |
| SBC | Surround by complement, |
| SBCI | Surround by complement inverted, |
| DP | Double pulsing within one cycle, |
| DDP | Delayed double pulse, and | combinations thereof.

23. A system as set forth in claim 19 and further including, for each of the test pins:
    second means, having an input coupled to the output of the providing means, for decoding the M-bits into one of $2^M$ multi-bit second control words; and
    comparator means, having an input coupled to the second decoding means, an input coupled to the timing signal generating means, and an input coupled to the test pin, for selecting, in accordance with information specified by the output of the second decoding means, a specified one of said timing signals for latching a signal received at the test pin, said comparator means further including means for comparing the latched signal to an expected signal, the expected signal being expressed as one or more bits of the second control word.

24. A test system having a plurality of test pins, for each of the test pins the system comprising:
    means for generating a test pattern for a test cycle, said test pattern generating means having an output for outputting said test pattern in an M-bit format;
    first decoding means, having an input coupled to said output of said test pattern generating means, for decoding said M-bits into one of $2^M$ control words, each of said control words being comprised of a first plurality of bits;
    timing generator means having an output for providing, during a test cycle, a plurality of timing signals; and waveform generator means having an output coupled to a test pin, said waveform generator means having a first input coupled to said output of said first decoding means and a second input coupled to said output of said timing generator means and being responsive to said first plurality of bits and to said plurality of timing signals for selecting, in accordance with information specified by said first plurality of bits, specified ones of said timing signals for generating a stimulus signal at the test pin; wherein
    said test pattern generating means outputs said test patterns at a rate of (x) test patterns per second, wherein said waveform generator means generates stimulus signals at a rate of (y) stimulus signals per second, and wherein (y)=n(x), where (n) is an integer greater than one.

25. A system as set forth in claim 24 and further including, for each of the test pins:
    second decoding means, having an input coupled to said output of said test pattern generating means, for decoding each of said M-bit test patterns into one of $2^M$ second control words, each of said second control words being comprised of a second plurality of bits;
    (n) receiver means each of which has an input coupled to the test pin and an output; and
    (n) comparator means each of which has an input coupled to the second decoding means, an input coupled to the timing signal generating means, and an input coupled to said output of an associated one of said (n) receiver means, each of said (n) comparator means including means for selecting, in accordance with information specified by the output of the second decoding means, a specified one of said timing signals for latching a signal output by said associated one of said (n) receiver means, each of said (n) comparator means further including means for comparing the latched signal to an expected signal, the expected signal being expressed as one or more bits of the second control word.

* * * * *